United States Patent [19]

Chan et al.

[11] Patent Number: 5,255,230
[45] Date of Patent: Oct. 19, 1993

[54] METHOD AND APPARATUS FOR TESTING THE CONTINUITY OF STATIC RANDOM ACCESS MEMORY CELLS

[75] Inventors: James Chan, Folsom; Robert E. Larsen, Shingle Springs; Steve Eskildsen, Folsom, all of Calif.

[73] Assignee: Intel Corporation, Santa Clara, Calif.

[21] Appl. No.: 816,635

[22] Filed: Dec. 31, 1991

[51] Int. Cl.$^5$ .............................................. G11C 29/00
[52] U.S. Cl. .................................. 365/201; 365/190; 365/203; 371/21.1
[58] Field of Search ...................... 365/201, 203, 190; 371/21.1

[56] References Cited

U.S. PATENT DOCUMENTS

| 4,956,819 | 9/1990 | Hoffmann et al. | 365/201 |
| 4,958,324 | 9/1990 | Devin | 365/201 |
| 4,999,813 | 3/1991 | Ohtsuka et al. | 365/201 |

Primary Examiner—Eugene R. LaRoche
Assistant Examiner—Son Dinh
Attorney, Agent, or Firm—Blakely, Sokoloff, Taylor & Zafman

[57] ABSTRACT

The method of testing a memory array of SRAM cells each of which includes memory transistors, bit and bit# lines, precharge circuitry, and an output test terminal involving the steps of connecting selected bit and bit# lines of selected SRAM cells to the output test terminal, disconnecting the memory transistors of the selected SRAM cells from the bit and bit# lines, disconnecting the bit and bit# lines from the precharge circuitry, enabling the column select circuitry to select the columns of the selected SRAM cells, applying a preselected level voltage to the output test terminal, and measuring any current which flows.

21 Claims, 4 Drawing Sheets

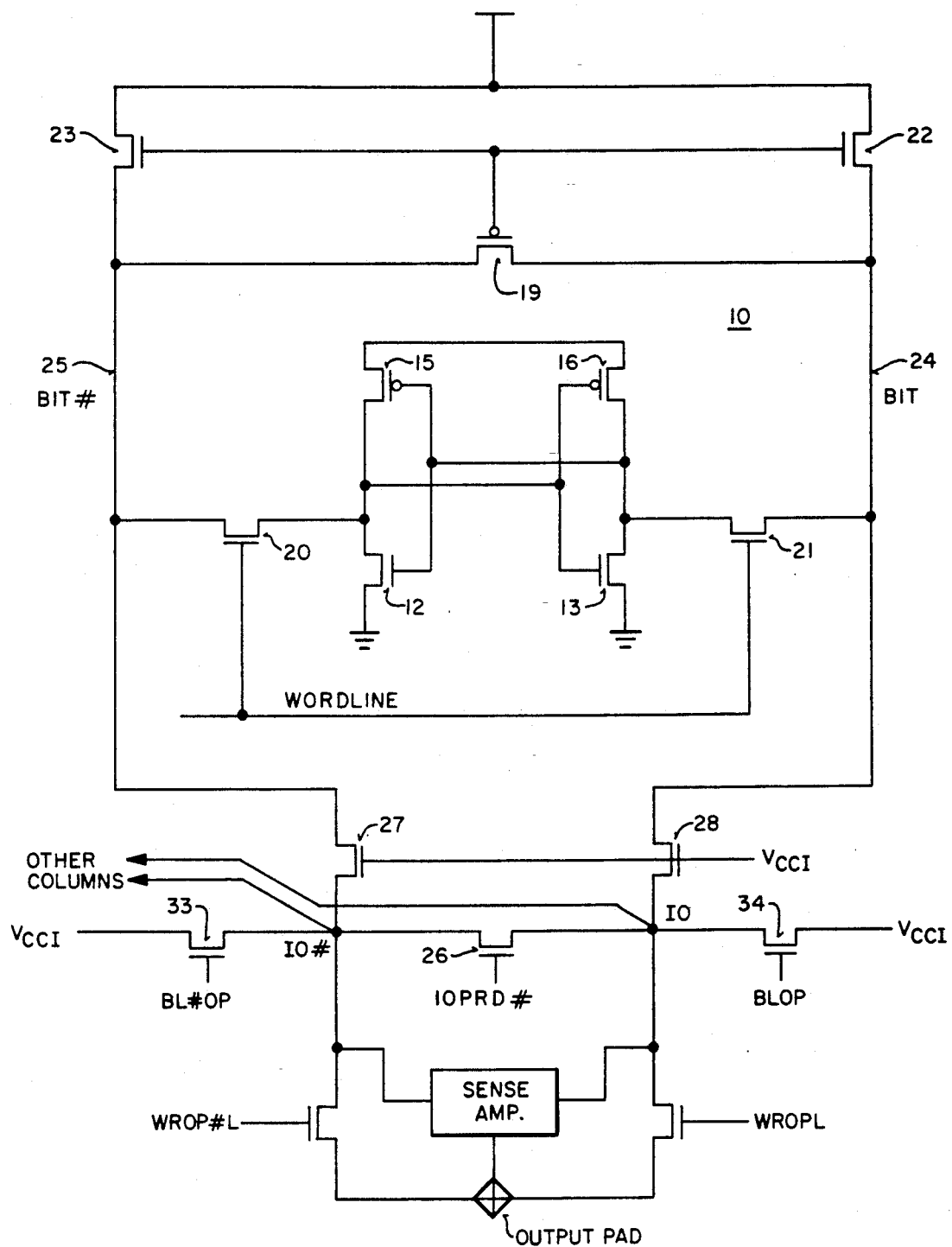
FIG_1

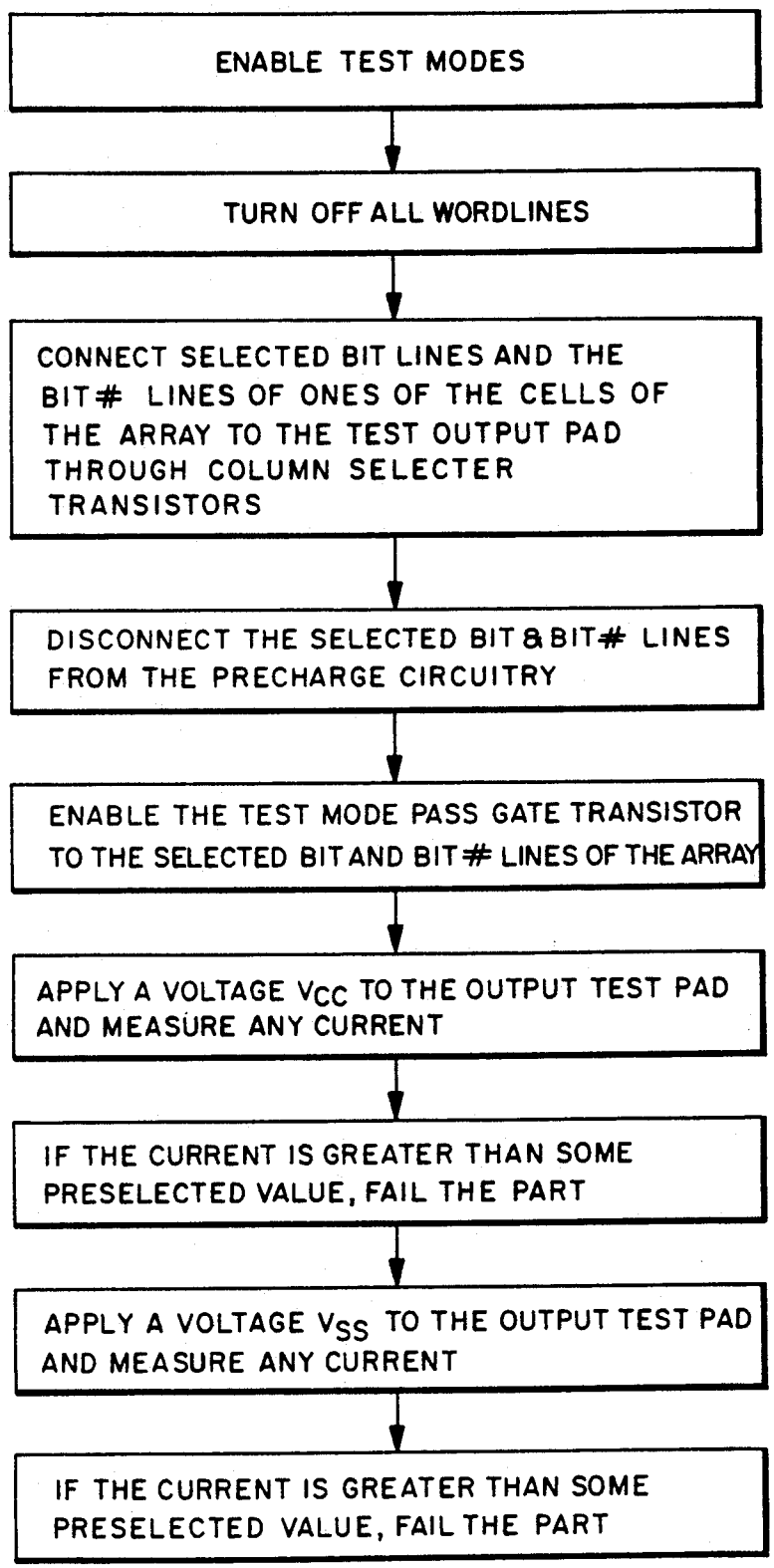

FIG_3
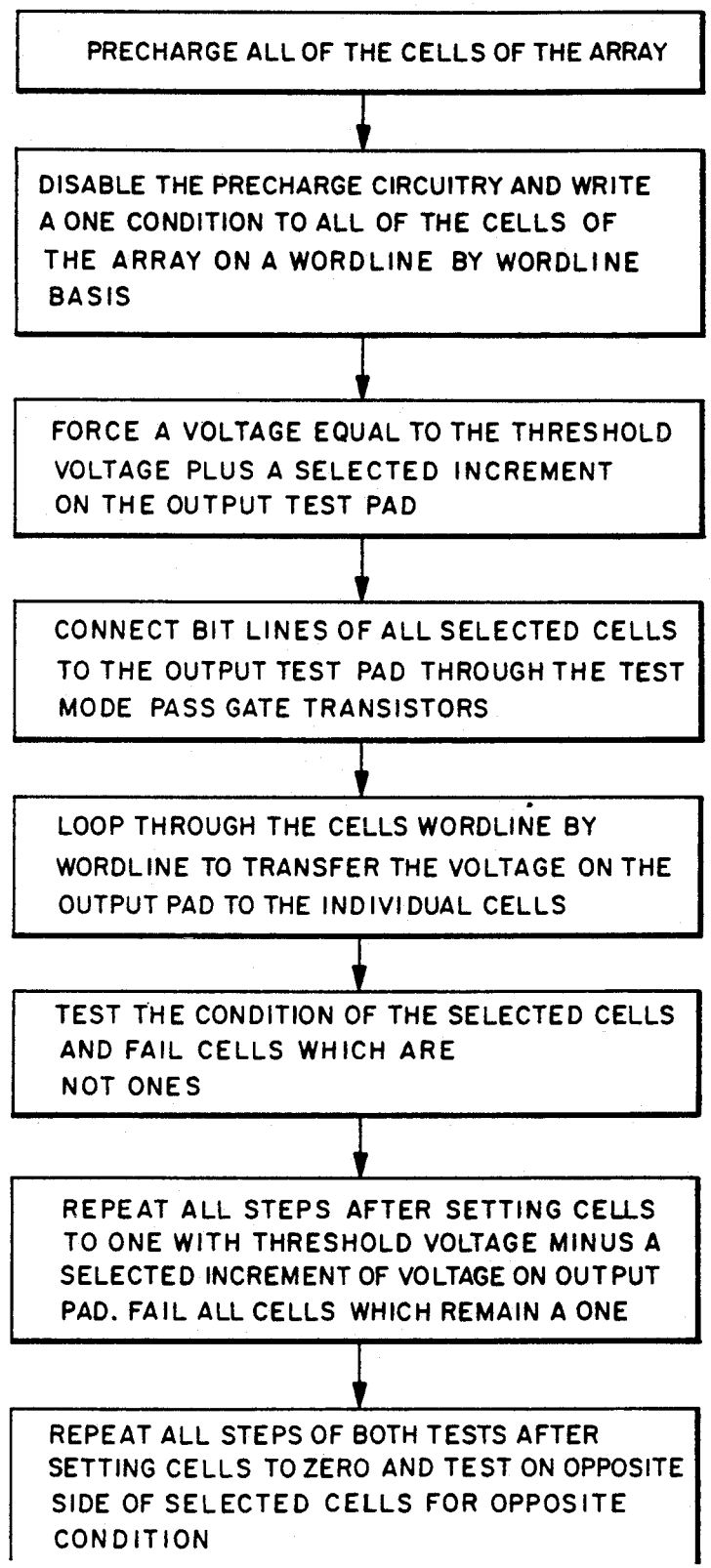

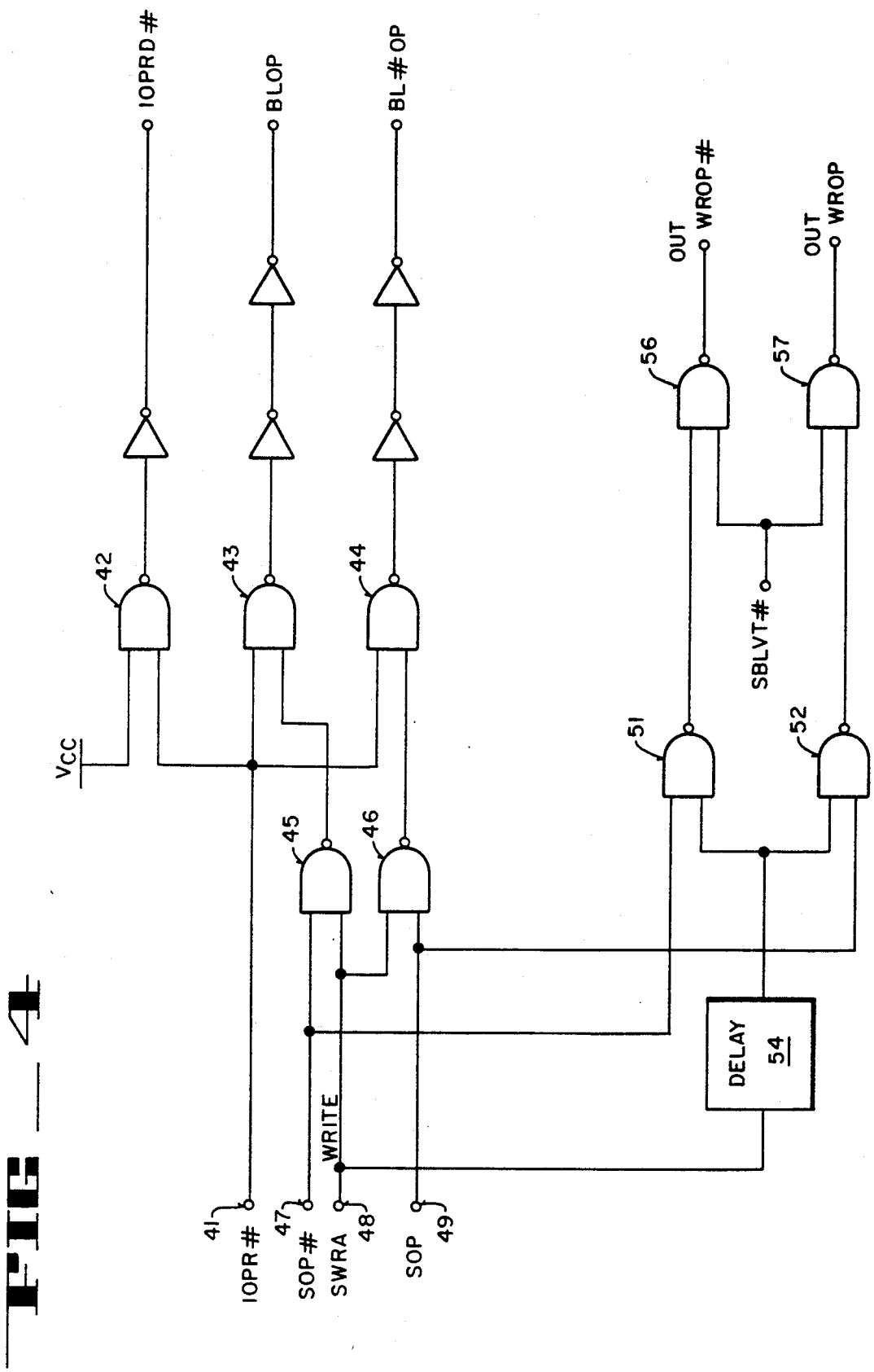
FIG_4

METHOD AND APPARATUS FOR TESTING THE CONTINUITY OF STATIC RANDOM ACCESS MEMORY CELLS

BACKGROUND OF THE INVENTION

1. Field Of The Invention

This invention relates to static random access memory (SRAM) and, more particularly, to apparatus for testing the condition of SRAM cells.

2. History Of The Prior Art

SRAM memory arrays are more useful for some purposes than are more conventional DRAM memory arrays because they are capable of storing data without the need to constantly refresh the cells of the memory. To provide this ability, the typical SRAM cell includes six transistors instead of the single transistor of a DRAM cell. Because SRAM cells include several more elements than DRAM cells, SRAM cells are more likely to have defects than are DRAM cells. If there is a defect in a SRAM cell, the replacement of such circuitry is expensive.

Although there are numerous tests used in industry to detect defects in memory arrays, these tests typically are able to detect only gross defects. There are two major reasons for this. First, the tests for defects which may be accomplished once an electronic part reaches production must be tests which can be conducted very rapidly or the cost of the part will increase radically. Second, because production line tests must be rapid, they must use the terminals available on the particular part. Usually, this means the parts must use the input and output terminals provided for normal use of the parts; certainly, the testing of individual memory cells using probes is excluding as too expensive for production line testing.

Dramatic defects in a SRAM cell may be easily detected by production line testing. For example, a typical production line test for detecting defects in a memory array is to write a data pattern to all of the cells of an array and then to read from all of the cells of the array to determine the conditions which resulted. If electric conductors within a cell are incorrectly short or open circuited, the cell will not store the correct one condition; and this will be detected by the test. Such tests are capable of measuring gross open circuit defects or gross short circuit defects.

However, important operating defects in a cell may take a very long time to become apparent. Often cells with marginal defects affecting operation will pass this sort of write/read test yet fail at some later time. For example, if a P channel pull up device in a SRAM cell is disconnected, this will cause the condition of the cell to switch after a long period so that the cell functions like a DRAM cell. However, testing for such a subtle defect would typically require waiting for the failure to occur. Such a test takes much too long for typical production line testing. Consequently, the more marginal defects often appear in a product after it has been sold and goes into use. This may cause a part to acquire a reputation as unreliable and cause it to be an economic failure even though the defect is corrected.

It is therefore desirable to provide tests for detecting such marginal defects in SRAM arrays using tests which may be accomplished in the relatively short time available for production testing.

SUMMARY OF THE INVENTION

It is, therefore, an object of the present invention to detect marginal defects in SRAM arrays during production testing.

It is another more specific object of the present invention to provide circuitry by which production line tests of marginal defects in SRAM arrays may be detected.

These and other objects of the present invention are realized in a method of testing a memory array of SRAM cells each of which includes memory transistors, bit and bit # lines, precharge circuitry, and an output test terminal comprising the steps of connecting the precharge transistors to all of the cells of the memory array, connecting selected bit and bit# lines of selected SRAM cells to the output test terminal, disconnecting the memory transistors of the selected SRAM cells from the bit and bit# lines, disconnecting the bit and bit# lines from the precharge circuitry, enabling the column select circuitry to select the columns of the selected SRAM cells, applying a preselected level voltage to the output test terminal, and measuring any current which flows. By changing the voltage applied and the selection of cells production line and engineering tests for short circuits may be conducted. Tests of a similar nature may be used to detect open circuit conditions in accordance with the present invention.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a circuit diagram illustrating a SRAM memory cell with circuitry for carrying out the present invention.

FIG. 2 a flow chart illustrating a first method for detecting short circuit defects in accordance with the invention.

FIG. 3 is a flow chart illustrating a second method for detecting open circuit defects in accordance with the invention.

FIG. 4 is a diagram illustrating additional circuitry for carrying out the present invention.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to methods and apparatus for operating a computer in processing electrical or other (e.g. mechanical, chemical) physical signals to generate other desired physical signals.

DETAILED DESCRIPTION OF THE INVENTION

Referring now to FIG. 1, there is illustrated a typical six transistor CMOS SRAM cell 10. The cell 10 includes first and second N channel field effect transistors (FETs) 12 and 13 and first and second P channel FETs 15 and 16 cross-coupled in typical fashion to provide a static memory cell. In contrast to a typical DRAM memory cell, a SRAM cell is capable of retaining a memory state without the necessity of refreshing that state on a regular basis. Power for the transistor devices of the memory cell 10 is provided by a source of voltage indicated as Vcc applied through a resistor 18 to the source terminals of the transistors 15 and 16 and a source of voltage Vss (which is typically ground) applied to the source terminals of the transistors 12 and 13. A pair of N channel FETs 20 and 21 each have their gate terminals connected to the word line and act as pass gates to close the paths between the bit lines 24 (bit) and 25 (bit#, where # indicates that an opposite logic state is normally placed on this bit line when placing the cell in a particular state) and the memory transistors of the cell 10. A second pair of N channel FETs 27 and 28 are connected to the individual bit lines to act as column selecters for a typical cell 10. A pair of N channel FETs 22 and 23 are utilized in a well known fashion to apply voltages to the bit lines 24 and 25 to precharge the memory cells. A P channel device 19 is connected between the bit and bit# line 24 and 25 to equalize the precharge voltage levels. Other precharging arrangements are, of course, possible.

In addition to the devices found in a conventional SRAM memory cell, a third pair of N channel FETs 30 and 31 have been added for the purposes of the present invention to function as test mode write pass gates to the cell 10; the normal write pass gates are not shown in the drawing as they are not important to the discussion of the invention. Another pair of N channel FETs 33 and 34 have also been added for the purposes of the present invention to function in a manner which will be explained hereinafter.

Short circuit conditions may exist because of leakage conditions between different conductive traces on the same or different layers of the chip on which the memory cells are positioned. It has been found by experience that the greatest chance for short circuit conditions in a CMOS SRAM memory array exists between either the bit or the bit# lines and the metallic conductors adjacent thereto. Consequently, by eliminating shorts between either of these bit lines and these adjacent metal conductors, a significant portion of cell shorting problems may be eliminated.

In order to test for short circuit conditions within an array, therefore, the arrangement of the present invention allows the memory transistors of the cells 10 to be disconnected from the bit and bit# lines and the value of the current through the bit lines and the bit# lines adjoining the cells of the array to be read. Theoretically, no current should flow through the bit lines once the cells have been disconnected from the bit and bit# lines. Consequently, the presence of current indicates that the memory array is defective. By connecting all of the bit and bit# lines of a memory array together, the total of all leakage current may be summed to produce a significant detectable current if leakage is occurring. Moreover, the testing may be extended to better isolate the portion of the circuitry having a defect. For example, all of the bit lines may be tested together or all of the bit# lines may be tested together to determine whether a short circuit condition affects either one or the other. The present invention also allows both the bit lines and the bit# lines of individual columns to be tested together or individually.

Since a short circuit condition (or a low resistance path) may exist from a bit or a bit# line to a conductor adjacent either one of those lines which is connected to either Vcc or to ground, a pair of tests must be run to determine whether any short circuits exist. These tests are illustrated in the method illustrated in FIG. 2. In a first test for short circuits to ground, the test mode condition is first enabled. Then, all of the cells are disconnected from the bit lines by disabling the wordline pass transistors 20 and 21. Next, all of the columns of the array are selected by enabling the column select transistors 27 and 28. Then, in the most general test, both the bit lines and the bit# lines of all of the cells of the array are connected to the test output pad by enabling each of the transistors 30 and 31 of each output. It should be noted that in the more specific tests which are described below, selected patterns of bit and/or bit# lines may be connected to the test output pad. After the precharge cycle, the bit and bit# lines are disconnected from the precharge circuitry by disabling the transistors 22 and 23.

Finally, the high level voltage Vcc is applied to the output pad, and any current is measured. It should be noted that, although not shown, the output pad is typically connected to the transistors 30 and 31 through buffering circuitry. If the absolute value of the magnitude of the current is greater than some preselected value, the memory array fails the test. More particularly, if the current exceeds the base reverse bias P/N leakage current of the transistors of the process connecting the bit and bit# lines to the output pad, the array fails the test. This operation tests for short circuits from the bit lines to metallic conductors which are joined to ground or a voltage level approaching ground.

A similar test includes all of the steps of the first test except that a low source voltage Vss (which is typically ground) is connected to the output pad. Again, if a current is measured which is greater than some preselected value, the memory array fails the test. This operation tests for short circuits from the bit lines to metallic conductors joined to Vcc or a voltage level approaching Vcc. This test may be conducted along with the first test by applying the low voltage after the high voltage has been applied and current flow tested.

As may be seen, connecting all of the bit lines and bit# lines to the output terminal allows a pair of very quick tests to be conducted to exclude most conditions which might cause a short circuit condition to exist within a SRAM memory cell. Such a pair of tests may easily be conducted in a production line situation without slowing the production operation and significantly increasing the labor cost.

If it is desirable to determine the specific short circuit which is the cause of the failure of an array, the tests for shorts may be limited so that only the bit lines or only the bit# lines are tested. This may be accomplished by enabling only the transistors 30 or only the transistors 31 connected to all of the cells 10 of the array. All of the other steps of the tests are the same. In a similar manner, the bit and bit# lines of a single column may be tested by enabling the column select transistors 27 and 28 of only a single column of the array. The test may be made even more selective so that it tests only the bit line of a single column by connecting to the output pad only through the transistor 31 or so that it tests only the bit# line of a single column by connecting to the pad only through the transistor 30. Such a test will easily help isolate defects which occur in production including those which repeat from part to part and can help lead to the elimination of such short circuits. However, this test is more useful in a laboratory isolation process rather than on a production line where the labor cost would probably be excessive.

Not only may a short circuit path from the bit lines to adjacent metallic conductors occur in a memory array, manufacturing defects may cause any of the normal connections between the memory transistors of a cell to be open or to have a higher than normal resistance. It has been determined that such open circuit conditions will affect the actual voltage at which a cell switches. Consequently, such an open circuit condition within a cell 10 may be detected by determining the voltage at which a typical cell should switch and attempting to switch the cells at voltages just above and just below that value of voltage. Testing whether a cell switches at a particular voltage will demonstrate whether that cell has open circuit conditions which will affect the operation of the cell.

The two voltages which are applied to determine whether cells have open circuit conditions will vary depending on the particular memory arrays. These voltages, just above and just below the voltage value at which the cell switches, must be carefully chosen after sufficient experiment to determine an acceptable range to assure that good cells are not excluded and bad cells included.

The actual tests which are performed in a preferred embodiment are conducted in the following manner. These tests are illustrated in the method described in FIG. 3. First, all of the cells of the array are precharged by connecting the precharge transistors 22 and 23. Then the precharge transistors 22 and 23 are disabled and one wordline is turned on. The cells of that wordline are written using the normal internal write circuitry of the array. Each individual cell of the array is written on a wordline by wordline basis by signals which should place all cells 10 in a condition in which each cell stores a one value. This may be done on a cell by cell, wordline by wordline, basis if only one cell may be selected at a time. In a preferred embodiment, either eight or sixteen cells of a wordline may be written at once, depending on the mode of operation.

Then, a voltage is forced on the output pad which voltage is of the predetermined value just above the threshold value (an incremental voltage above the cell threshold voltage, where the cell threshold voltage is the voltage level which would trip a typical six transistor SRAM cell). Next, a write cycle using the test mode write circuits commences in which the cells are written by connecting the bit lines 24 of all cells to the output pads by turning on the transistor 31 connected to each bit line 24. Again, the writing is on a wordline by wordline basis where the signal data is offered on a byte or a word basis for the array depending on the number of output pads available. During each such write operation, the precharge transistors are typically connected and then disconnected before the output pad is connected. Furthermore, in the preferred embodiment of the invention, the transistors 31 are only turned on during the test mode write cycle for the selected cells so that the inadvertent switching of the cells is precluded. If the cells do not have open circuit conditions, then they should switch at a value approximating the normal threshold voltage. Thus with the forcing voltage on the output pad just above the threshold voltage, good cells will not switch. Then, the forcing voltage is disconnected by turning off the transistors 31. Finally, all the cells 10 of the array are read on a cell by cell basis to determine if they are all in the one state. If all cells are in the one state, the memory array passes the test.

If the array passes this first test, then a second test is run. This second test is similar to the first except that the voltage forced on the bit lines is a preselected voltage an incremental amount below the threshold voltage. This should cause all good cells to switch to zero. Then, the array is read to see if all cells hold zeroes. If they do, the memory array passes this test.

If the array passes this second test, then a third test is run which is similar to the first test except that the array is initially set to all zeroes and the bit# lines are connected to the pad. As with the first test, a voltage is forced on the bit# lines which is just above the threshold voltage. This should not cause any good cells to switch. Thus, the array is read to see if all cells hold zeroes. If they do, the memory array passes this test.

Finally, if the array passes this third test, then a fourth test is run which is similar to the second except that the array is initially set to all zeroes and the bit# lines are connected to the pad. As with the second test, the voltage forced on the bit# lines is just below the threshold voltage. This should cause all good cells to switch. Thus, the array is read to see if all cells hold ones. If they do, the memory array passes this test.

In all of these open circuit tests, a clamping voltage equal to Vcc minus Vtn (where Vtn is the threshold voltage of the N channel device of the memory cell) may be applied to the bit or bit# line on the side of the memory cell opposite the side to which the preselected voltage is being applied. For example, if the preselected voltage is applied to the bit line 24, then a voltage equal to Vcc minus Vtn may be applied to the bit# line 25. This will have the effect of stabilizing the switching point of the memory transistors so that the switching point of the cell does not shift. The application of the voltage Vcc minus Vtn to the bit or bit# line may be accomplished by closing the appropriate one of two transistors 33 or 34 to provide a path to the source voltage.

The open circuit tests may be utilized in a manner similar to the short circuit tests to determine particular columns and cells which may contain open circuits. The number of columns may be restricted by utilizing the column select transistors to select a single column. The tests in each case remain the same. FIG. 4 illustrates a circuit 40 which may be utilized in addition to the circuitry already described to accomplish the testing described above. The circuit 40 includes the logic utilized in the preferred embodiment of the invention to provide the signals for operating the various transistors associated with the memory cell 10 of FIG. 1 to accomplish the various short circuit and open circuit tests described above. At the left of the figure are a number of terminals at which signals are applied to select the proper gating transistors for the tests. The first of these terminals 41 receives a signal IOPR# for activating the precharge transistors 22 and 23; this signal is an active low signal and produces (via a NAND gate 42) an active low signal IOPRD# for operating a transistor 26 to enable the precharge transistors 22 and 23. The signal IOPR# is also transferred to an input terminal of a pair of NAND gates 43 and 44 the outputs of which enable and disable the transistors 33 and 34 by which clamping voltages are applied in the open circuit tests to the bit line opposite the side at which the predetermined voltage is being applied to determine if the cell will switch.

The other inputs to the NAND gates 43 and 44 are from the outputs of a pair of NAND gates 45 and 46. The NAND gate 45 receives an active high input signal SOP# applied at an input terminal 47 which indicates that the bit# side of the memory cell is to receive the predetermined switching voltage and the transistor 34 is to be enabled to clamp the bit line side of the cell. An active high write signal applied at a terminal 48 completes the signals to the NAND gate 45 to cause the operation and produce an output signal BLOP. Similarly, the NAND gate 46 receives the write signal and an active high signal SOP applied at a terminal 49 to select the bit# line of the cell for clamping using an active high output signal BL#OP.

The signals SOP and SOP# are also applied to a pair of NAND gates 51 and 52 which also receive the write signal after a delay through a delay element 54 which in the preferred embodiment includes a number of inverter stages. The outputs from the NAND gates 51 and 52 are transferred to a second pair of NAND gates 56 and 57 each of which also receives an input signal SBLVT# used for activating one or the other or both of the write pass gate transistors 30 and 31 to connect to the pad at which a voltage may be applied to conduct the tests. The output of the gate 56 is a signal WROP# which enables the transistor 30 while the output of the gate 57 is a signal WROP which enables the transistor 31.

In order to conduct a short circuit test the appropriate ones of the signals SOP and SOP# are applied along with the write signal. This generates signals to generate outputs from either or both of the gates 51 and 52. These are applied to the gates 56 and 57 and with the signal SBLVT# produce the appropriate output signals for activating either or both of the transistors 30 and 31 which connect the pad at which the testing voltage is applied to the bit lines.

These same signals may be utilized in the same manner to enable the appropriate transistors to conduct the open circuit tests described above. In order to conduct an open circuit test, the appropriate one of the transistors 33 or 34 is enabled to clamp the non-selected bit line of the memory cell.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method of testing a memory array of SRAM cells arranged in columns, each SRAM cell including memory transistors, bit and bit # lines, the memory array including precharge circuitry, an output test terminal, and column select circuitry, the method comprising the steps of:

connecting the precharge circuitry to all of the SRAM cells of the memory array, selecting from the SRAM cells selected SRAM cells, the selected SRAM cells having selected bit and bit # lines;

connecting the selected bit and bit# lines of the selected SRAM cells to the output test terminal, disconnecting the memory transistors of the selected SRAM cells from the selected bit and bit# lines, disconnecting the selected bit and bit# lines from the precharge circuitry, enabling the column select circuitry to select a column including the selected SRAM cells, applying a preselected voltage to the output test terminal, and measuring a current flowing through the output test terminal.

2. The method of testing a memory array of SRAM cells of claim 1 wherein the preselected voltage is at a high positive voltage level.

3. The method of testing a memory array of SRAM cells of claim 1 wherein the preselected voltage is at a voltage level near ground.

4. The method of testing a memory array of SRAM cells of claim 1 wherein the selected SRAM cells include all of the SRAM cells of the memory array.

5. The method of testing a memory array of SRAM cells of claim 1 wherein the selected SRAM cells include only a single SRAM cell.

6. The method of testing a memory array of SRAM cells of claim 1 wherein only the selected bit lines of the selected SRAM cells are connected to the output test terminal.

7. The method of testing a memory array of SRAM cells of claim 6 wherein the selected SRAM cells include all of the SRAM cells.

8. The method of testing a memory array of SRAM cells of claim 1 wherein only the selected bit# lines of the selected SRAM cells are connected to the output test terminal.

9. The method of testing a memory array of SRAM cells of claim 8 wherein the selected SRAM cells include all of the SRAM cells.

10. A method of testing a memory array of SRAM cells arranged in columns, each SRAM cell including memory transistors and bit and bit# lines, the memory array including precharge circuitry, and an output test terminal, the method comprising the steps of:

selecting from the memory array selected SRAM cells, the selected SRAM cells having selected bit and bit# lines;

connecting the selected bit and bit# lines of the selected SRAM cells to the output test terminal, disconnecting the selected SRAM cells from the selected bit and bit# lines;

applying a selected voltage to the output test terminal, and measuring a current flowing through the selected bit and bit# lines to the output test terminal.

11. The method of testing a memory array of SRAM cells of claim 10 further comprising the steps of:
   writing to a subset of the SRAM cells of the memory array to store a one value before applying the selected voltage to the output test terminal,
   connecting only the selected bit lines of the selected SRAM cells to the output test terminal, and
   determining a state of the selected SRAM cells.

12. The method of testing a memory array of SRAM cells of claim 11 wherein the selected SRAM cells includes all of the SRAM cells.

13. The method of testing a memory array of SRAM cells of claim 11 wherein the selected voltage has a first voltage level adapted to switch cells without defects from a first state to a second state.

14. The method of testing a memory array of SRAM cells of claim 11 wherein the selected voltage has a second voltage level adapted to prevent switching of cells without defects from a first state to a second state.

15. The method of testing a memory array of SRAM cells of claim 11 wherein the selected bit# lines are connected to a source voltage.

16. The method of testing a memory array of SRAM cells of claim 10 wherein only the selected bit# lines are connected to the output test terminal, and further comprising the step of:
   determining a state of the selected SRAM cells.

17. The method of testing a memory array of SRAM cells of claim 16 wherein the selected SRAM cells include all SRAM cells.

18. The method of testing a memory array of SRAM cells of claim 16 wherein the selected voltage has a first voltage level adapted to switch cells without defects from a first state to a second state.

19. The method of testing a memory array of SRAM cells of claim 16 wherein the selected voltage has a second voltage level adapted to prevent switching of cells without defects from a first state to a second state.

20. The method of testing a memory array of SRAM cells of claim 16 in which the selected bit lines are connected to a source voltage.

21. An arrangement for testing a memory array of SRAM cells, arranged in columns each SRAM cell including memory transistors, bit and bit# lines, the memory array including precharge circuitry, the arrangement comprising:
   an output test terminal,
   means for selecting from the memory array selected SRAM cells, each selected SRAM cell having selected bit and bit# lines;
   means for connecting the selected bit and bit# lines of the selected SRAM cells to the output test terminal,
   means for disconnecting the memory transistors of the selected SRAM cells from the selected bit and bit# lines,
   means for disconnecting the selected bit and bit# lines from the precharge circuitry,
   means for enabling the columns select circuitry to select a column including the selected SRAM cells,
   means for applying a preselected voltage to the output test terminal, and
   means for measuring a current flowing through the output test terminal.

* * * * *